United States Patent
Oh et al.

(10) Patent No.: US 9,506,141 B2
(45) Date of Patent: Nov. 29, 2016

(54) METHOD FOR MANUFACTURING A MOLYBDENUM SPUTTERING TARGET FOR BACK ELECTRODE OF CIGS SOLAR CELL

(75) Inventors: Ik Hyun Oh, Gwangju (KR); Hyun Kuk Park, Iksan-si (KR); Seung Min Lee, Gunsan-si (KR); Jun Mo Yang, Daejeon (KR)

(73) Assignee: KOREA INSTITUTE OF INDUSTRIAL TECHNOLOGY, Cheonan-Si (KR)

( * ) Notice: Subject to any disclaimer, the term of this patent is extended or adjusted under 35 U.S.C. 154(b) by 340 days.

(21) Appl. No.: 14/002,666

(22) PCT Filed: Mar. 7, 2012

(86) PCT No.: PCT/KR2012/001653
§ 371 (c)(1),
(2), (4) Date: Aug. 30, 2013

(87) PCT Pub. No.: WO2012/121542
PCT Pub. Date: Sep. 13, 2012

(65) Prior Publication Data
US 2013/0336831 A1    Dec. 19, 2013

(30) Foreign Application Priority Data

Mar. 8, 2011    (KR) .................. 10-2011-0020586

(51) Int. Cl.
*C23C 14/34* (2006.01)
*H01L 31/0224* (2006.01)
(Continued)

(52) U.S. Cl.
CPC .......... *C23C 14/3414* (2013.01); *B22F 3/105* (2013.01); *C22C 1/045* (2013.01); *H01L 31/022425* (2013.01); *H01L 31/03923* (2013.01); *B22F 3/1017* (2013.01); *B22F 3/1028* (2013.01); *B22F 3/14* (2013.01); *B22F 2003/1051* (2013.01); *B22F 2999/00* (2013.01); *Y02E 10/541* (2013.01); *Y02P 70/521* (2015.11)

(58) Field of Classification Search
CPC .................. C23C 14/3414; B22F 2999/00
USPC ........................................ 148/518
See application file for complete search history.

(56) References Cited

U.S. PATENT DOCUMENTS

2008/0193798 A1    8/2008   Lemon et al.

FOREIGN PATENT DOCUMENTS

KR    10-2005-0081149 A    8/2005
KR    10-2007-0057225 A    6/2007
(Continued)

*Primary Examiner* — Weiping Zhu
(74) *Attorney, Agent, or Firm* — Lex IP Meister, PLLC (57) ABSTRACT

A method for manufacturing a molybdenum sputtering target for a back electrode of a CIGS solar cell is provided to minimize thermal activating reaction by employing an electric discharge plasma sintering process. The method for manufacturing a molybdenum sputtering target for a back electrode of a CIGS solar cell comprises the steps of: charging molybdenum powder in a mold of graphite material, mounting the mold in a chamber of an electric discharge sintering apparatus, making a vacuum in the chamber, forming the molybdenum powder to the final target temperature while maintaining constant pressure on the molybdenum powder, heating the molybdenum powder in a predetermined heating pattern when reaching the final target temperature, maintaining the final target temperature for 1 to 10 minutes, and cooling the inside of the chamber while maintaining a constant pressure.

4 Claims, 6 Drawing Sheets (51) Int. Cl.
    *B22F 3/105*      (2006.01)
    *C22C 1/04*      (2006.01)
    *H01L 31/0392*      (2006.01)
    *B22F 3/10*      (2006.01)
    *B22F 3/14*      (2006.01)

(56) References Cited

FOREIGN PATENT DOCUMENTS

KR     10-2009-0041148 A     4/2009
KR     20090041148 A   *   5/2009  ............. C23C 14/34

* cited by examiner

METHOD FOR MANUFACTURING A MOLYBDENUM SPUTTERING TARGET FOR BACK ELECTRODE OF CIGS SOLAR CELL

TECHNICAL FIELD

The present invention relates to a method for manufacturing a molybdenum sputtering target for a back electrode of a copper indium gallium selenide (CIGS) solar cell, and more particularly, to a method for manufacturing a molybdenum sputtering target for a back electrode of a CIGS solar cell having high purity while having a uniform composition of a high density using an electric discharge plasma sintering process.

BACKGROUND ART

Since molybdenum (Mo) is a material having a low resistance value, that is, electrical resistance of 53.4 nΩ·m, it has superior electrical conductivity and thermal stability. Accordingly, molybdenum (Mo) is actively used for a back electrode of a copper indium gallium selenide (CIGS) solar cell.

A sputtering process is a film forming process using plasma to generate ions striking a sputtering target so as to stack a layer of atoms of the sputtering target on a substrate. The sputtering process is particularly used to generate a metal layer in various manufacturing processes in semiconductor and photoelectricity industries. Properties of the film formed during sputtering are related to intrinsic properties of the sputtering target, such as formation of a secondary phase having various crystal sizes and distributions. Accordingly, the sputtering target is regarded as an important factor in determining properties of a thin film.

Among existing solar cells, the CIGS solar cell has highest light absorbance coefficient ($\sim 10^5$ cm$^{-1}$), a direct transition type band gap and heat stability to demonstrate little thermosetting property. Molybdenum (Mo) having good electrical conductivity and thermal stability is used for a back electrode of the CIGS solar cell.

A metal target manufacturing technology is largely divided into a dissolution/casting method and a powder metallurgy method. The dissolution/casting method is mostly widely used for forming a metal target because of various advantages, including facilitated mass production and reduced manufacturing costs.

However, since the dissolution/casting method has limitations in crystal particulate control and high density achievement, a multi-step process, including a rolling process, heat treatment, and so on, is required. In addition, according to the recent demand for a highly functional target material, many alloy targets are developed. However, the dissolution/casting method has a limitation in controlling a fine structure, making it difficult to form a target having uniform properties. On the other hand, the powder metallurgy method has several advantages, including uniform phase distribution and fine crystal particulate control, easy preparation of a material having high purity and a high melting point, a large degree of freedom in designing compositions and composition ratios, thereby manufacturing high performance, highly functional targets. Therefore, in recent years, the powder metallurgy method is actively used as a substitute for the dissolution/casting method.

In particular, since molybdenum has a high melting point of 2623° C., it is difficult to prepare molybdenum using the dissolution/casting method. Thus, it is often the case that molybdenum is prepared using the powder metallurgy method.

In the conventional powder metallurgy method for manufacturing a sputtering target, a hot isostatic pressing (HIP) method or a hot pressing (HP) method has been widely used, which can obtain a high-density sintered body by simultaneously applying temperature and pressure.

However, recently, for the following reasons: limitation in crystal particulate control due to a long molding process time, internal and external physical properties of a sintered body based on an external heating method, and high processing costs, and with the rapid advances in the IT industry, there is a demand for high performance, highly efficient sputtering target materials and development of new processing technologies is required.

DISCLOSURE OF THE INVENTION

In order to overcome the above-mentioned shortcomings, the present invention provides a method for manufacturing a molybdenum sputtering target for a CIGS solar cell using an electric discharge plasma sintering process in a simplified process within a short time, by which particle growth of a molybdenum sintered body to be used as a sputtering target for a solar cell can be controlled while having a high density, a uniform composition and high purity, and the processing cost can be reduced, compared to HP or HIP.

According to an aspect of the invention, there is provided a method for manufacturing a molybdenum sputtering target of a CIGS solar cell, the method including (a) filling molybdenum powder in a mold made of graphite, (b) mounting the mold filled with the molybdenum powder into a chamber of a discharge plasma sintering device, (c) vacuating the inside of the chamber, (d) forming a mold until a final target temperature is reached while elevating the temperature according to a preset temperature elevating pattern in a state in which the molybdenum powder in the mold is maintained at a constant pressure, (e) maintaining the final target temperature for 1 to 10 minutes longer, and (f) cooling the inside of the chamber while maintaining a predetermined pressure.

The final target temperature may be in a range of 1100 to 1300° C.

In the step (d), the pressure of the inside of the mold may be maintained at 50 to 70 MPa, and the step (d) may include (d-1) firstly elevating the temperature of the molybdenum powder in the mold to 600° C., which is a first target temperature, at a rate of 30° C./min to 100 μmin, (d-2) maintaining the first target temperature for 1 to 3 minutes, (d-3) secondly elevating the temperature of the molybdenum powder in the mold to 700° C., which is a second target temperature, at a rate of 10 μmin to 50° C./min, (d-4) maintaining the second target temperature for 1 to 3 minutes, (d-5) thirdly elevating the temperature of the molybdenum powder in the mold to 800° C., which is a third target temperature, at a rate of 10 μmin to 50° C./min, (d-6) maintaining the third target temperature for 1 to 3 minutes, (d-7) fourthly elevating the temperature of the molybdenum powder in the mold to 900° C., which is a fourth target temperature, at a rate of 10 μmin to 50 (d-8) maintaining the fourth target temperature for 1 to 3 minutes, (d-9) fifthly elevating the temperature of the molybdenum powder in the mold to 1000° C., which is a fifth target temperature, at a rate of 10° C./min to 50° C./min, (d-10) maintaining the fifth target temperature for 1 to 3 minutes, (d-11) sixthly elevating the temperature of the molybdenum powder in the mold to 1100° C., which is a sixth target temperature, at a rate of 10 μmin to 50° C./min, (d-12) maintaining the sixth target temperature for 1 to 3 minutes, (d-13) seventhly elevating the temperature of the molybdenum powder in the mold to 1200° C., which is the final target temperature, at a rate of 10° C./min to 50° C./min, and (d-14) maintaining the final target temperature for 1 to 10 minutes.

The step (a) may include filling the molybdenum powder into the mold and performing a preliminary pressing process using a molding press with a pressure of 1400 to 1600 kg·f to be allowed to stand undisturbed for 1 to 10 minutes.

A plurality of upper spacers made of graphite may be formed between an upper electrode in the chamber to apply an electric field to the mold and an upper punch entering the mold from a top, the plurality of upper spacers having outer diameters gradually decreasing toward the upper punch, and a plurality of lower spacers made of graphite are formed between a lower electrode in the chamber and a lower punch entering the mold from a bottom, the plurality of lower spacers having outer diameters gradually decreasing toward the lower punch, the upper spacer is provided with a first upper spacer, a second upper spacer and a third upper spacer, which are arranged from the upper electrode to the upper punch in a circular shape, the lower spacer is provided with a first lower spacer, a second lower spacer and a third lower spacer, which are arranged from the lower electrode to the mold in a circular shape, the first upper spacer and the first lower spacer have a diameter of 350 mm and a thickness of 30 mm, the second upper spacer and the second lower spacer have a diameter of 300 mm and a thickness of 60 mm, and the third upper spacer and the third lower spacer have a diameter of 200 to 250 mm and a thickness of 30 to 60 mm.

The step (c) may include vacuating the inside of the chamber to a pressure of $1\times10^0$ Pa to $1\times10^{-3}$ Pa to prevent the molybdenum powder from being oxidized or to suppress formation of a secondary phase due gas or impurity, and the step (f) comprises cooling while allowing the inside of the mold to stand undisturbed at a pressure of 50 to 70 MPa.

Advantageous Effect(s)

In the method for manufacturing a molybdenum sputtering target for a CIGS solar cell, when a molybdenum sintered body suitably used as a sputtering target is manufactured using an electric discharge plasma sintering process, the sintered body can be manufactured in a high density while having a uniform composition with little particle growth of the molybdenum sintered body and high purity in a simplified process within a short time.

BRIEF DESCRIPTION OF THE DRAWINGS

The objects, features and advantages of the present invention will be more apparent from the following detailed description in conjunction with the accompanying drawings, in which.

BEST MODE FOR CARRYING OUT THE INVENTION

Hereinafter, a method for manufacturing a molybdenum sputtering target for solar cell according to a preferred embodiment of the present invention will be described in detail with reference to the accompanying drawings.

Figure 1:
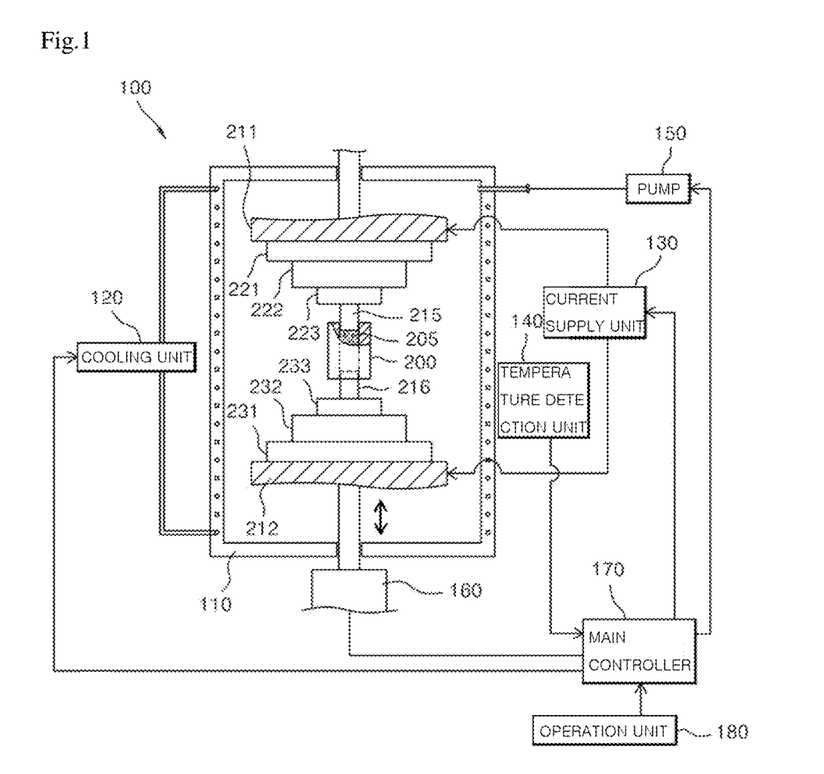
FIG. 1 schematically illustrates a discharge plasma sintering device used in a method for manufacturing a molybdenum sputtering target for a CIGS solar cell according to an embodiment of the present invention.

FIG. 1 schematically illustrates a discharge plasma sintering device used in a method for manufacturing a molybdenum sputtering target for a CIGS solar cell according to an embodiment of the present invention.

Referring to FIG. 1, the discharge plasma sintering device 100 includes a chamber 110, a cooling unit 120, a current supply unit 130, a temperature detection unit 140, a pump 150, a pressing device 160, a main controller 170 and an operation unit 180.

An upper electrode 211 and a lower electrode 212 are provided inside a chamber 110 to be spaced apart from each other. In addition, although not shown, the upper and lower electrodes 211 and 212 are formed to allow cooling water to be circulated for heat dissipation.

The cooling unit 120 is configured to circulate cooling water to a cooling water flowing pipe provided on an inner water of the chamber 110 and cooling water flowing pipes provided at the upper and lower electrodes 211 and 212.

The current supply unit 130 is controlled by the main controller 170 and applies pulse current to the mold 200 through the upper and lower electrodes 211 and 212.

The temperature detection unit 140 preferably employs an infrared temperature detection method in which the temperature is detected through a see-through window provided in the chamber 110.

The pump 150 is configured to exhaust internal air of the chamber 110 to the outside.

The pressing device 160 is installed to press molybdenum powder 205 filling the inside of the mold 200. In the illustrated embodiment, a cylinder is installed to raise and lower a bottom of the lower electrode 212.

The main controller 170 controls the cooling unit 120, the current supply unit 130, the pump 150 and the pressing device 160 according to the operation command set by the operation unit 180, receives information about the temperature detected by the temperature detection unit 140 and displays the temperature information on a display unit (not shown).

The mold 200 is shaped of a cylinder and has a receiving groove formed at its center to allow the molybdenum powder to be loaded.

In the discharge plasma sintering device 100, the current applied from the upper and lower electrodes 211 and 212 to the mold 200 is concentrated, thereby increasing heat elevating efficiency. In addition, in order to reduce unnecessary energy consumption, spacers 221, 222, 223, 231, 232 and 233 are preferably inserted between the mold 200 and the upper and lower electrodes 211 and 212.

That is to say, first to third upper spacers 221, 222 and 223 made of graphite and having outer diameters gradually decreasing toward the upper punch 215 are provided between the upper electrode 211 for applying an electric field to the mold 200 and the upper punch 215 inserted into the mold 200 from a top. In addition, first to third lower spacers 231 to 233 made of graphite and having outer diameters gradually decreasing toward the lower punch 216 are provided between the lower electrode 212 and the lower punch 216 entering the mold 200 from a bottom.

With the insertion structures of the upper and lower spacers 221, 222, 223, 231, 232 and 233, the current applied from the upper and lower electrodes 211 and 212 to the mold 200 through the punch 215(216) is concentrated, thereby increasing the power utilization efficiency and heat generation efficiency. Preferably, the first upper spacer 221 and the first lower spacer 231 may have a diameter of 350 mm and a thickness of 30 mm, the second upper spacer 222 and the second lower spacer 232 may have a diameter of 300 mm and a thickness of 60 mm, and the third upper spacer 223 and the third lower spacer 233 may have a diameter of 200 to 250 mm and a thickness of 30 to 60 mm.

Hereinafter, a method for manufacturing a molybdenum (Mo) sintered body using the discharge plasma sintering device 100 having the aforementioned configuration will be described.

The method for manufacturing a molybdenum sputtering target for solar cell according to an embodiment of the present invention includes steps of filling, mounting, vacuating, molding, maintaining and cooling.

First, in the filling step, molybdenum (Mo) powder is filled in the mold 200 for discharge plasma sintering. The lower punch 216 is inserted into a bottom portion of the discharge plasma sintering mold 200, the molybdenum (Mo) powder is filled into the inside of the mold 200, and the upper punch 215 is then inserted into a top portion of the mold 200.

Preferably, the molybdenum (Mo) powder is filled into the inside of the mold 200 and a preliminary pressing process is performed using a molding press with a pressure of 1400 to 1600 kg·f to then be allowed to stand undisturbed for 1 to 10 minutes.

Next, after the molybdenum (Mo) powder is filled into the mold 200, the mold 200 is mounted into the chamber 110 of the discharge plasma sintering device.

In the vacuating, the internal space of the chamber 110 is vacuated. That is to say, the internal air of the chamber 110 is exhausted using the pump 150 to make a vacuum. Here, the inside of the chamber 110 is vacuated to reach $1 \times 10^0$ Pa to $1 \times 10^{-3}$ Pa, thereby preventing the molybdenum powder from being oxidized or suppressing formation of a secondary phase due to gas or impurity.

In the forming of the mold, the molybdenum powder 205 is heated and molded. The pressing device 160 is actuated to maintain the molybdenum powder 205 in the mold 200 at an initial pressure of 50 to 70 MPa, and the powder in the mold 200 is heated according to a preset temperature elevating pattern or isothermal pattern, which will be described with reference to FIG. 2.

Figure 2:
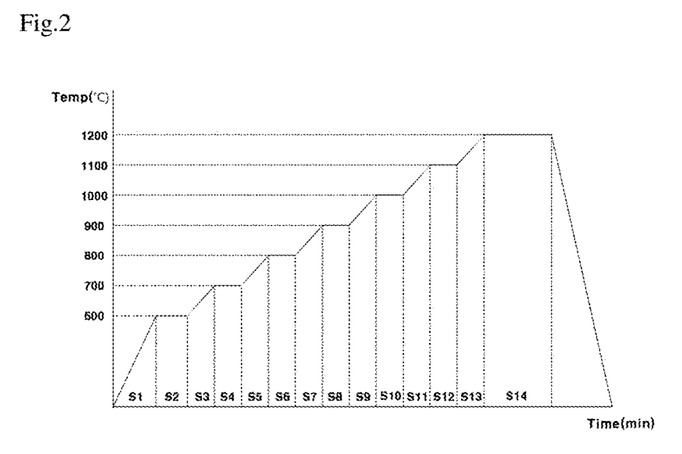
FIG. 2 is a graph illustrating a temperature elevating process in sintering molybdenum according to the present invention.

Here, in order to increase relative density of the molybdenum sintered body, elevating final target temperatures of the mold 200 are measured using a pyrometer to set the target temperature to 1100° C. to 1300° C., preferably to 1200° C.

First, the molybdenum powder in the mold 200 is firstly elevated to 600° C., which is a first target temperature, at a rate of 30° C./min to 100° C./min in a state in which the internal pressure of the mold 200 is maintained at 50 to 70 MPa (step S1).

Next, when the first target temperature, that is, 600° C., is reached, an isothermal state of 600° C. is maintained for 1 to 3 minutes (step S2).

After the step S2, the molybdenum powder in the mold 200 is secondly elevated to 700° C., which is a second target temperature, at a rate of 10° C./min to 50° C./min in a state (step S3).

When the second target temperature, that is, 700° C., is reached, an isothermal state of 700° C. is maintained for 1 to 3 minutes (step S4).

After the step S4, the molybdenum powder in the mold 200 is thirdly elevated to 800° C., which is a third target temperature, at a rate of 10° C./min to 50° C./min in a state (step S5).

When the third target temperature, that is, 800° C., is reached, an isothermal state of 800° C. is maintained for 1 to 3 minutes (step S6).

After the step S6, the molybdenum powder in the mold 200 is fourthly elevated to 900° C., which is a fourth target temperature, at a rate of 10° C./min to 50° C./min in a state (step S7).

When the fourth target temperature, that is, 900° C., is reached, an isothermal state of 900° C. is maintained for 1 to 3 minutes (step S8).

After the step S8, the molybdenum powder in the mold 200 is fifthly elevated to 1000° C., which is a fifth target temperature, at a rate of 10° C./min to 50° C./min in a state (step S9).

When the fifth target temperature, that is, 1000° C., is reached, an isothermal state of 1000° C. is maintained for 1 to 3 minutes (step S10).

After the step S10, the molybdenum powder in the mold 200 is sixthly elevated to 1100° C., which is a sixth target temperature, at a rate of 10° C./min to 50° C./min in a state (step S11).

When the sixth target temperature, that is, 1100° C., is reached, an isothermal state of 1100° C. is maintained for 1 to 3 minutes (step S12).

After the step S12, the molybdenum powder in the mold 200 is seventhly elevated to 1200° C., which is a final target temperature, at a rate of 10° C./min to 50° C./min in a state (step S13).

When the final target temperature, that is, 1200° C., is reached, an isothermal state of 1200° C. is maintained for 1 to 10 minutes, preferably for 7 minutes to eliminate a temperature difference between center and edge portions of the sintered body (step S14).

Table 1 shows temperature elevating rates and time of maintaining isothermal states during a molding process.

TABLE 1

|  | S1 | S2 | S3 | S4 | S5 | S6 | S7 | S8 | S9 | S10 | S11 | S12 | Total |
|---|---|---|---|---|---|---|---|---|---|---|---|---|---|
| 30° C./min | 10 min | 2 min | 6 min | 2 min | 6 min | 2 min | 6 min | 2 min | 6 min | 2 min | 6 min | 7 min | 57 min |
| 60° C./min | 8 min | 2 min | 5 min | 2 min | 3 min | 2 min | 3 min | 2 min | 2 min | 2 min | 2 min | 7 min | 40 min |
| 80° C./min | 4 min | 2 min | 2 min | 2 min | 2 min | 2 min | 2 min | 2 min | 2 min | 2 min | 2 min | 7 min | 31 min |

In the cooling step, after the final target temperature is reached and the isothermal state is maintained, the inside of the chamber 110 is cooled while maintaining the pressure applied to the molybdenum powder 205 in the mold 200.

Figure 6:
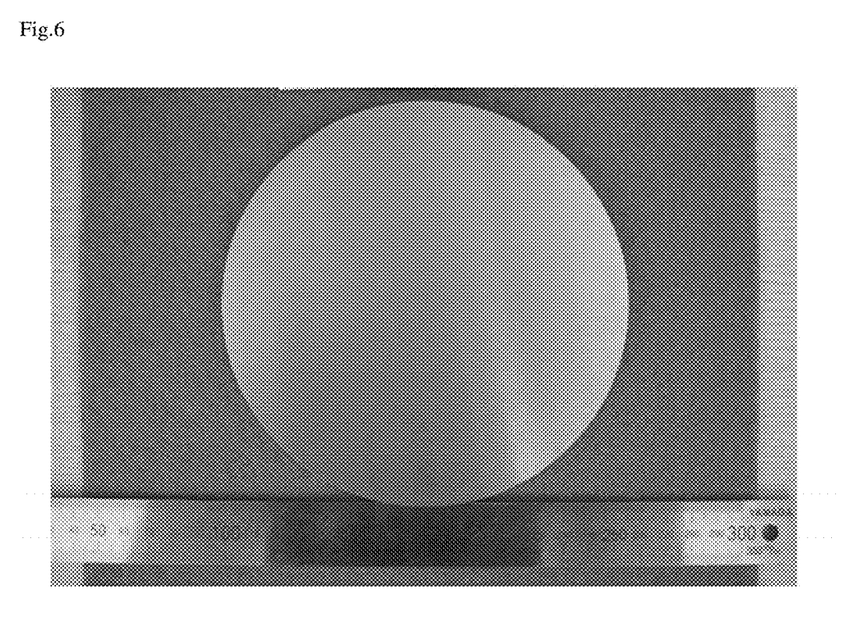
FIG. 6 is an actual photograph of a molybdenum sintered body having a diameter of 150 mm and a thickness of 6.53 mm, manufactured by measuring the temperature using a pyrometer with a final target temperature set to 1200° C.

After the cooling step, the molybdenum sintered body is released from the mold 200, thereby completing the manufacture of the molybdenum sintered body, as shown in FIG. 6.

In the aforementioned manufacturing process, low-voltage, pulse-like high current is induced to gaps between particles of the molybdenum powder 205 by the current applied through the upper and lower electrodes 211 and 212, and the sintered body is manufactured using diffusion of heat and electric fields due to high energy of discharge plasma instantaneously generated by an arc discharge, generation of heat due to electric resistance of the mold 200, a pressing force and electrical energy. In addition, high-temperature sputtering occurring due to a spark discharge, may remove the gas and impurity existing on surfaces of powder particles, thereby demonstrating a cleaning effect.

The discharge plasma sintering process employs a directly heating method, in which current is allowed to directly flow through the specimen, that is, molybdenum powder, through the punch 215(216). That is to say, heat is generated in the specimen at the same time when heat is generated in the mold 200, there is a small temperature difference between the inside and the outside of the specimen. In addition, since the temperature is relatively low and the sintering time is short, a thermal activating reaction occurring while the sintering process is performed may be minimized. In particular, when the molybdenum (Mo) powder is sintered, it is possible to manufacture the sintered body having a high density to be suitable for a sputtering target, fine crystal particles and high purity.

In addition, in the method for manufacturing the molybdenum sputtering target for a CIGS solar cell, the sintered body having a large area with a diameter in a range of 100 to 200 mm and a thickness in a range of 6 to 15 mm, a high density, high purity and fine crystal particles, can be manufactured.

Figure 3:
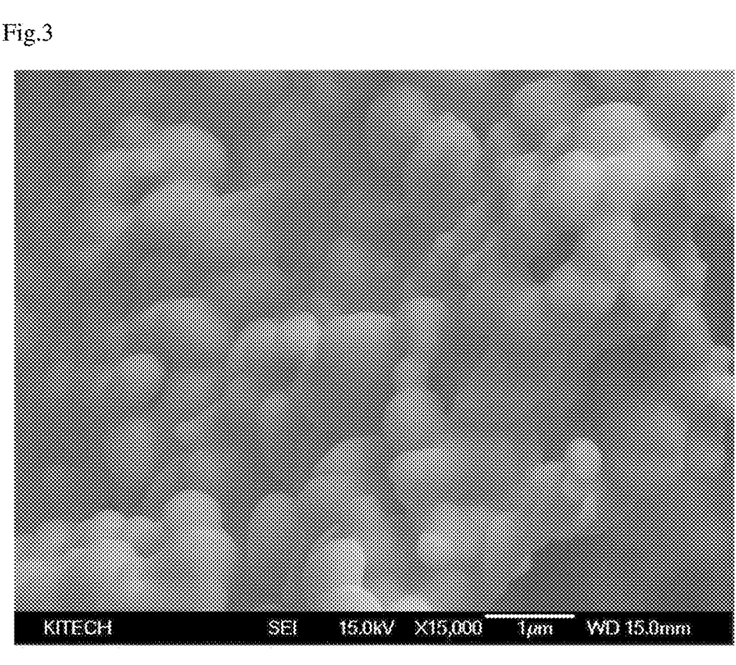
FIG. 3 is a scanning electron microscope (SEM) photograph of molybdenum powder before a sintering process in a method for manufacturing a molybdenum sputtering target for a CIGS solar cell according to an embodiment of the present invention.

FIG. 3 illustrates conglomeration of molybdenum (Mo) powder used as specimen in experiments, which has a spherical shape and a particle size in a range of approximately 1 to 2 μm.

Meanwhile, it was confirmed that there was a temperature difference between various positions, that is, center and edge portions, of the manufactured sintered body. In addition, thermocouples were mounted at center and edge portions of the punch to identify temperatures of the inside and outside of the sintered body and a physical property difference between the inside and outside of the sintered body, and a pyrometer was installed at the outside of the sintered body to measure the temperatures. However, the highest temperature that can be measured by the thermocouple is 1100° C., which is lower than the sintering temperature. Thus, the temperatures were elevated under the processing condition shown in FIG. 2 up to the highest temperature that the thermocouples could withstand, and temperature differences depending on various positions at the final temperature are listed in Table 2, and then temperature deviations were estimated based on the temperature differences.

TABLE 2

|  |  | Final temperature | Temperature difference between center and edge portions | Temperature deviation between center and mold |
|---|---|---|---|---|
| Thermocouple | Center | 1078.9° C. | 48.9° C. | 192.6° C. |
| Thermocouple | Edge | 1030° C. | 48.9° C. | 192.6° C. |
| Pyrometer | Mold | 886.3° C. | 48.9° C. | 192.6° C. |

As understood from Table 2, the temperature difference between the center and edge portions of the sintered body was approximately 49° C. and the temperature difference between the center and the mold was approximately 200° C. When a material having a high melting point is sintered, a sintering process is generally performed while the temperature of the mold is measured using a pyrometer. Referring to the temperature differences listed in Table 2, when the sintering process is performed at a temperature of 1100~1300° C., the actual temperature of the inside of the sintered body was estimated to be in a range of approximately 1300° C. to approximately 1500° C.

Figure 4:
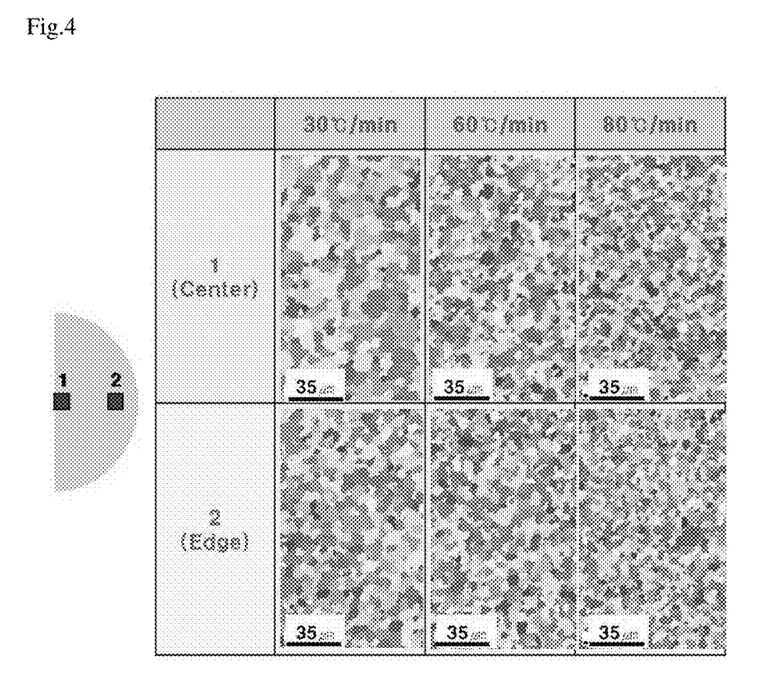
FIG. 4 is an electron backscatter diffraction (EBSD) photograph of center and edge portions of a molybdenum sintered body manufactured by elevating the temperature at rates of 30° C./min, 60° C./min and 80° C./min with a target temperature set to 1200° C. after a surface of the molybdenum sintered body is electropolished.

In addition, the center and edge portions of the sintered body, which were sintered under the processing condition shown in FIG. 2, were cut to measure physical property differences, EBSD analyses depending on various positions and changes in temperature elevating rates were performed, and results thereof are shown in FIG. 4 and Table 3. As confirmed from Table 3 and as shown in FIG. 4, deviations of crystal particle sizes and relative densities were negligible. According to the conventional sintering process, such a slight physical property difference is scarcely demonstrated in a single process within a short time, and uniform physical properties may be demonstrated due to the slight temperature deviation.

TABLE 3

|  | Grain Size (μm) | | Relative Density (%) | |
| --- | --- | --- | --- | --- |
|  | Center | Edge | Center | Edge |
| 30° C./min | 7.9 | 7.2 | 99.6 | 99.3 |
| 60° C./min | 4.9 | 4.9 | 99.4 | 99.0 |
| 80° C./min | 4.4 | 4.1 | 99.2 | 99.0 |

Figure 5:
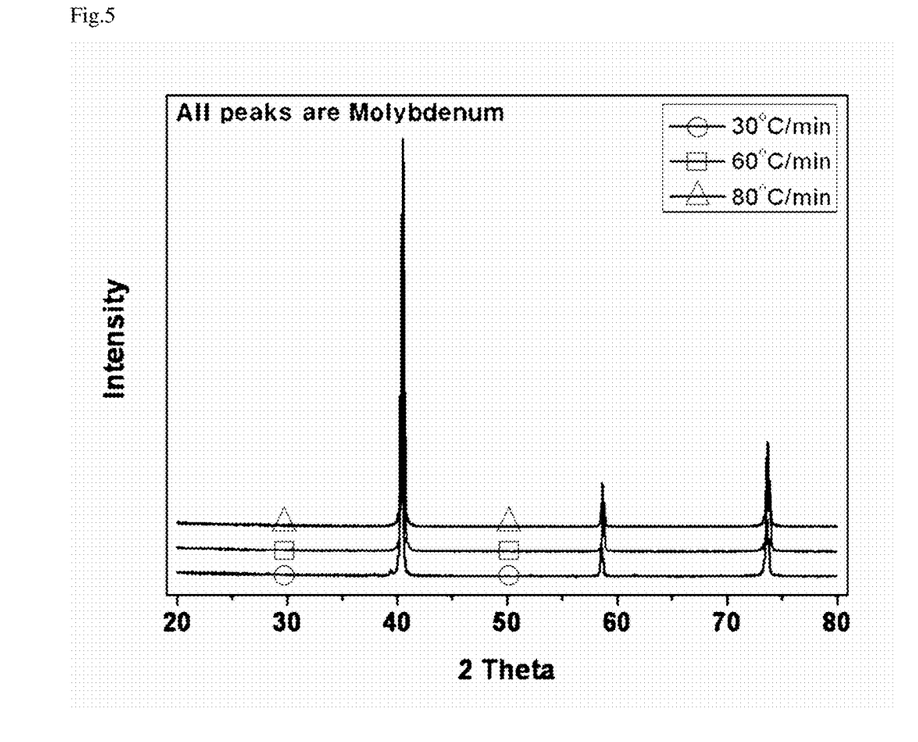
FIG. 5 is an X-ray Diffraction (XRD) photograph of a molybdenum sintered body manufactured by elevating the temperature at rates of 30° C./min, 60° C./min and 80° C./min with a target temperature set to 1200° C.

Meanwhile, in order to confirm whether there is a phase change of the manufactured sintered body and whether a secondary phase is generated, X-ray diffraction (XRD) analyses were performed, and the results thereof are shown in FIG. 5. As shown in FIG. 5, it was confirmed that a secondary phase, such as Mo$_2$C, was not generated and only a pure Mo phase was generated.

In addition, during the above-described manufacturing process, high-temperature sputtering occurring due to a high vacuum atmosphere or a spike discharge may remove the gas and impurity existing on surfaces of powder particles, thereby advantageously removing oxygen, which is the most important factor in manufacturing a sputtering target, unlike existing equipments.

Table 4 shows ICP purity analysis results of initial powder and the finally sintered body.

TABLE 4

| | Element (ppm) | | | | | | | | | | | | Purity Total |
| --- | --- | --- | --- | --- | --- | --- | --- | --- | --- | --- | --- | --- | --- |
| | Si | Al | Fe | Ca | Cr | P | Pb | Cu | Ni | W | O | N | ClHONMgClHON |
| Initial powder | 410 | 14 | 61 | 90 | 19 | 30 | 10 | 25 | 21 | — | 1400 | 110 | 3N5 |
| After sintering | 37 | 10 | 77 | 10 | 17 | 10 | 10 | 10 | 10 | 30 | 270 | 21 | 3N7 |

As confirmed from Table 4, the sputtering target having high purity without a change in the purity of initial powder can be manufactured using the high-temperature sputtering occurring due to a spike discharge.

Although exemplary embodiments of the present invention have been described in detail hereinabove, it should be understood that many variations and modifications of the basic inventive concept herein described, which may appear to those skilled in the art, will still fall within the spirit and scope of the exemplary embodiments of the present invention as defined by the appended claims.

What is claimed is:

1. A method for manufacturing a molybdenum sputtering target of a CIGS solar cell, the method comprising: (a) filling molybdenum powder in a mold made of graphite; (b) mounting the mold filled with the molybdenum powder into a chamber of a discharge plasma sintering device; (c) evacuating the inside of the chamber; (d) heating the mold until a final target temperature is reached while elevating the temperature according to a preset temperature elevating pattern in a state in which the molybdenum powder in the mold is maintained at a constant pressure; (e) maintaining the final target temperature for 1 to 10 minutes; and (f) cooling the inside of the chamber while maintaining a predetermined pressure,
wherein in the step (d), the pressure of the inside of the mold is maintained at 50 to 70 MPa, and the step (d) comprises: (d-1) firstly elevating the temperature of the molybdenum powder in the mold to 600.degree. C., which is a first target temperature, at a rate of 30.degree. C./min to 100.degree. C./min; (d-2) maintaining the first target temperature for 1 to 3 minutes; (d-3) secondly elevating the temperature of the molybdenum powder in the mold to 700.degree. C., which is a second target temperature, at a rate of 10.degree. C./min to 50.degree. C./min; (d-4) maintaining the second target temperature for 1 to 3 minutes; (d-5) thirdly elevating the temperature of the molybdenum powder in the mold to 800.degree. C., which is a third target temperature, at a rate of 10.degree. C./min to 50.degree. C./min; (d-6) maintaining the third target temperature for 1 to 3 minutes; (d-7) fourthly elevating the temperature of the molybdenum powder in the mold to 900.degree. C., which is a fourth target temperature, at a rate of 10.degree. C./min to 50.degree. C./min; (d-8) maintaining the fourth target temperature for 1 to 3 minutes; (d-9) fifthly elevating the temperature of the molybdenum powder in the mold to 1000.degree. C., which is a fifth target temperature, at a rate of 10.degree. C./min to 50.degree. C./min; (d-10) maintaining the fifth target temperature for 1 to 3 minutes; (d-11) sixthly elevating the temperature of the molybdenum powder in the mold to 1100.degree. C., which is a sixth target temperature, at a rate of 10.degree. C./min to 50.degree. C./min; (d-12) maintaining the sixth target temperature for 1 to 3 minutes; and (d-13) seventhly elevating the temperature of the molybdenum powder in the mold to 1200.degree. C., which is the final target temperature, at a rate of 10.degree. C./min to 50.degree. C./min.

2. The method of claim 1, wherein the step (a) comprises filling the molybdenum powder into the mold and performing a preliminary pressing process using a molding press with a pressure of 1400 to 1600 kgf to be allowed to stand undisturbed for 1 to 10 minutes.

3. The method of claim 2, wherein a plurality of upper spacers made of graphite are formed between an upper electrode in the chamber to apply an electric field to the mold and an upper punch entering the mold from a top, the plurality of upper spacers having outer diameters gradually decreasing toward the upper punch, and a plurality of lower spacers made of graphite are formed between a lower electrode in the chamber and a lower punch entering the mold from a bottom, the plurality of lower spacers having outer diameters gradually decreasing toward the lower punch, the upper spacer is provided with a first upper spacer, a second upper spacer and a third upper spacer, which are arranged from the upper electrode to the upper punch in a circular shape, the lower spacer is provided with a first lower spacer, a second lower spacer and a third lower spacer, which are arranged from the lower electrode to the mold in a circular shape, the first upper spacer and the first lower spacer have a diameter of 350 mm and a thickness of 30 mm, the second upper spacer and the second lower spacer have a diameter of 300 mm and a thickness of 60 mm, and the third upper spacer and the third lower spacer have a diameter of 200 to 250 mm and a thickness of 30 to 60 mm.

4. The method of claim 3, wherein the step (c) comprises evacuating the inside of the chamber to a pressure of $1\times10^{0}$ Pa to $1\times10^{-3}$ Pa to prevent the molybdenum powder from being oxidized or to suppress formation of a secondary phase due to gas or impurity, and the step (f) comprises cooling while allowing the inside of the mold to stand undisturbed at a pressure of 50 to 70 MPa.

\* \* \* \* \*